United States Patent [19]
Ahonen

[11] Patent Number: 5,240,583
[45] Date of Patent: Aug. 31, 1993

[54] APPARATUS TO DEPOSIT MULTILAYER FILMS

[75] Inventor: Robert G. Ahonen, Cedar, Minn.

[73] Assignee: Honeywell Inc., Minneapolis, Minn.

[21] Appl. No.: 820,705

[22] Filed: Jan. 14, 1992

[51] Int. Cl.$^5$ ............................................. C23C 14/34
[52] U.S. Cl. ......................... 204/298.04; 204/192.11;
204/298.15; 204/298.28
[58] Field of Search ...................... 204/192.11, 298.04,
204/298.15, 192.22, 298.23, 298.26, 298.28;
250/423 R, 425, 427

[56] References Cited

U.S. PATENT DOCUMENTS 4,793,908 12/1988 Scott et al. ................. 204/298.26 X
5,064,520 11/1991 Miyake et al. ............. 204/298.23 X

FOREIGN PATENT DOCUMENTS 2301593 8/1974 Fed. Rep. of Germany ........................ 204/298.23
2602798 2/1988 France ............................ 204/298.27

*Primary Examiner*—Nam X. Nguyen
*Attorney, Agent, or Firm*—Ronald E. Champion

[57] ABSTRACT

The present invention discloses an apparatus to deposit thin films on a substrate. An ion beam produced by an ion gun, which is radio-frequency excited, impinges upon a target. The target is translatable laterally by a target holder to bring different target materials into contact with the ion beam. The targets are held at an angle to the ion beam. The target material sputtered off the target by collision with the ions is deposited on substrates held above the targets. The substrates are moved into and out of the path of the sputtered material by an unique rotating device for uniform deposition of the sputtered material.

15 Claims, 6 Drawing Sheets

APPARATUS TO DEPOSIT MULTILAYER FILMS

TECHNICAL FIELD

This invention relates to an apparatus to deposit multilayer films. Specifically, the invention relates to depositing material sputtered from a target by collision of a high energy ion beam produced by a radio-frequency excited ion beam gun.

BACKGROUND OF THE INVENTION

Many schemes and apparatus have been devised to produce multilayer thin films. These films are used in semiconductor fabrication, optical waveguides, and highly reflective mirrors such as those used in ring laser gyroscopes. Sputter deposition usually takes place in a vacuum chamber where a target material is impacted by ion beams to sputter material off the target by collision mechanics. This sputtered material would then be deposited on a substrate to produce the device.

Several problems have been associated with prior art systems. It has been difficult to generate a beam of ions which is free of contaminants and of a high enough energy to be effective. It has also been difficult to impart enough energy to the sputtered material to ensure a uniform deposited film of a known thickness, density and surface smoothness. The major problems, therefore, have been with the source of the ions to perform the sputtering. Ionizing sources and methods have, therefore, been the subject of significant work.

The simplest of these ionizing methods was to use a filament, or thermionic emitter, to generate electrons within the ionization chamber. The electrons created by the filament collided with the gas molecules, knocking off electrons from the gas molecules to cause the molecules to become positively charged. This method, although operable, had several disadvantages. The filaments tended to have a short life. Because the filaments were thermionic emitters and were at a negative electrical potential relative to the ionized gas, material was sputtered or evaporated off of the filament which caused contamination to be introduced into the ion beam.

An improvement upon the filament type of ion generation was the introduction of a hollow cathode. This eliminated the need of a filament and greatly increased the operational life. Potentials for contamination of the ion beam due to materials present in the hollow cathode were still present.

Further advances of ion beam generating devices included using a high-frequency generator coupled to either plates or coils within the chamber to ionize the gas molecules through excitation by the high-frequency energy. These materials, especially coils within the plasma field, also created contamination in the ion beam. An advancement, placing a coil outside the gas chamber helped to eliminate this contamination. However, external magnetic fields were usually required to contain the plasma within the chamber, enhancing ionization efficiency and to prevent arcing from the plasma to various components within the chamber. The arcing could cause a rapid degradation of the plasma and ultimate destruction of the components within the chamber. Most of the attempts to use high-frequency plasma generation also required that the generator coil be cooled by internal water means. This introduced the problem of having each end of the coil at the same potential, preferably ground potential, to prevent the high-frequency energy from being bled off to ground. Elaborate matching networks, or tight control of the length of the waveguide or coil, were required in order to accomplish these goals.

A need, therefore, exists for being able to generate a beam of positively charged gas molecules without contaminating the beam by the plasma touching contaminating fixturing within the chamber and without the need of water cooled coils or external magnetic fields.

A need also exists to translate substrates within the deposition chamber to insure uniform deposition.

A further need exists to be able to translate targets within the deposition chamber to produce multilayer films.

SUMMARY OF THE INVENTION

The present invention deposits thin films in either a single layer or multiple layers on a substrate. A supply of inert gas is fed to a radio-frequency excited ion beam gun where the gas is ionized into positively charged gas ions into a plasma. The gas ions are extracted from the ion beam gun in a stream or column of ions. The stream of ions is shaped by shutters and directed against targets within a vacuum chamber. The target material is held in a translatable target holder positioned at an angle to the beam. Multiple targets may be held by the holder and selectively translated into and out of the stream of ions.

A plurality of substrates are held above the target s that target molecules sputtered off the target by collision mechanics may be deposited on the substrates. The substrates are mounted in a planetary holder which rotates the substrates into and out of the stream of sputtered target molecules to allow uniform deposition.

It is an object of the invention to uniformly deposit thin films on a substrate.

It is a further object of the invention to provide inexpensive and repeatable thin film deposition using ions created in a radio-frequency excited ion beam gun.

It is another object of the invention to deposit multilayer films of different material on a plurality of substrates.

These and other objects of the invention will be apparent from the following detailed description of a preferred embodiment when read in connection with the appended drawings.

DESCRIPTION OF THE PREFERRED EMBODIMENT

Figure 1:
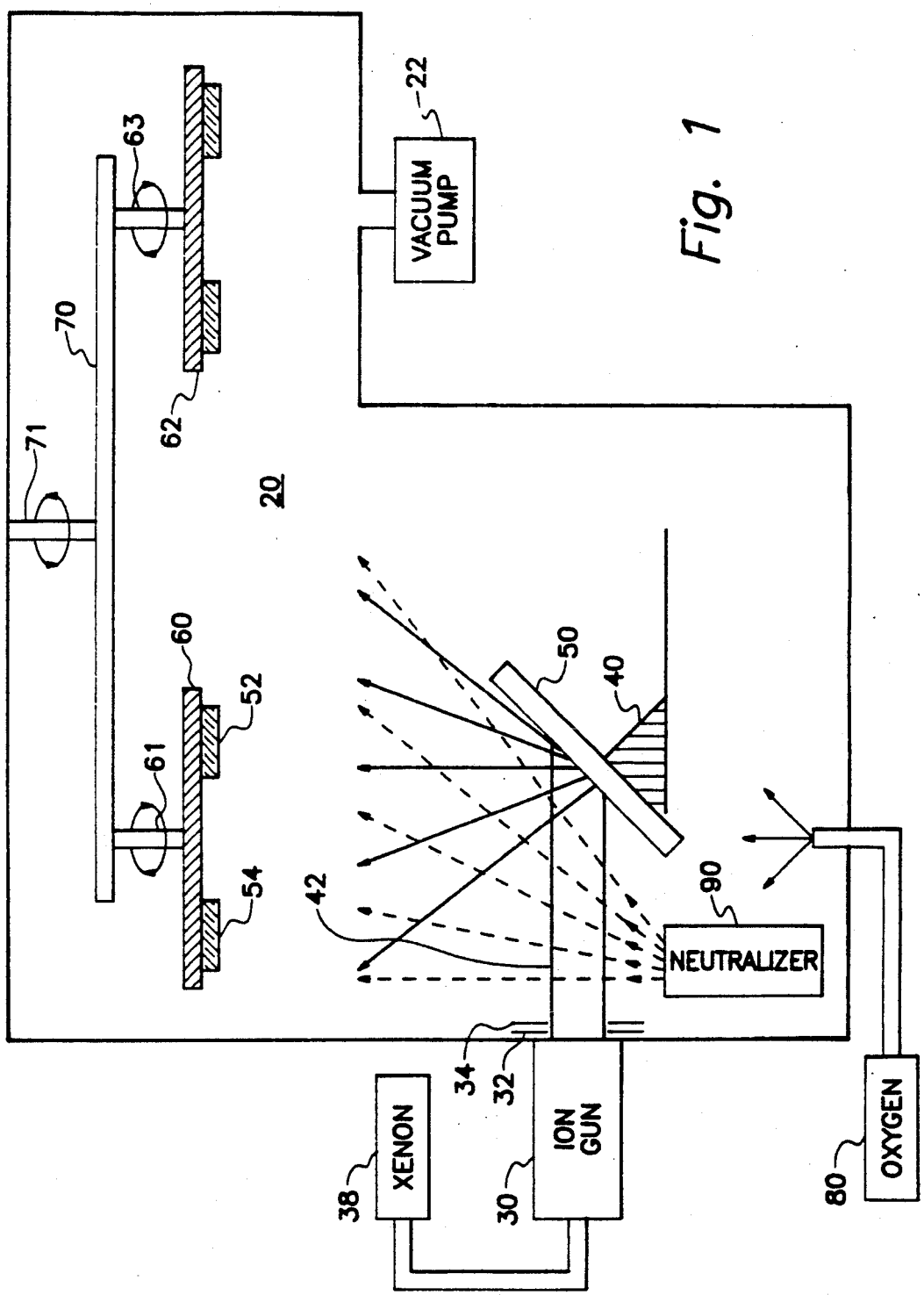
FIG. 1 is a side view of a sputter deposition apparatus as described in the present invention.

Referring now to FIG. 1, a vacuum chamber 20 is provided which can be evacuated to a very low pressure by vacuum pump 22. In a preferred embodiment, the vacuum chamber 20 operates at a pressure of $1 \times 10^{-4}$ Torr. Mounted to the wall of the vacuum chamber 20 is an ion gun 30, whose details and operation will be explained below. The ion gun 30 is supplied with a source of inert gas 38 which, in the preferred embodiment, is xenon. Other inert gases, such as argon, have also been used with equal results. The ion beam gun 30 produces a stream of positively charged ions 42 by means of radio-frequency excitation, as will be explained below. This ion beam 42 is extracted from ion gun 30 and progresses through a plurality of shutters 32 and 34. These shutters 32 and 34 are, in the preferred embodiment, circular titanium plates having apertures of various diameters through which the ion beam 42 is directed and shaped into a coherent beam of positively charged inert gas ions.

A translatable target holder 40 is provided to hold a target 50 at an acute angle to the ion beam 42. The ion beam impinges the target 50 and knocks material off the target in the direction of the solid arrows of FIG. 1. The material sputtered off the target is directed toward a plurality of substrates 50 and 52 which are held by a substrate holder 60. Substrate holder 60 has an axis 61 about which the substrate holder 60 can rotate. There are a plurality of substrate holders, such as shown as substrate holders 60 and 62 in FIG. 1. Each of the substrate holders has a centrally located central axis, such as axis 63 for substrate holder 62. All of the substrate holders are held by a common carrier 70. The common carrier 70 has a central axle 71 about which the carrier can rotate. This arrangement allows the individual substrates 52, 54, etc. to follow an elliptical retrograde motion within the vacuum chamber 20. As can be seen if FIG. 1, as the carrier 70 rotates and the individual substrate holder 60 rotate on their axis, the substrates 52 and 54 are rotated into and out of the stream of sputtered material shown by the solid arrows in FIG. 1.

Because the beam of ions 42 are positively charged, a neutralizer 90 is provided to provide electrons to combine with the positive molecules to form a stream of material with a net zero electrical charge. This prevents positive ions from building up inside the vacuum chamber 20 and extinguishing the ion beam 42. Because, as will be explained below, the majority of the materials used in the sputter deposition of thin films for this invention are oxides, a source of oxygen 80 is provided to maintain a proper stoichiometric ratio for efficient deposition.

Figure 2:
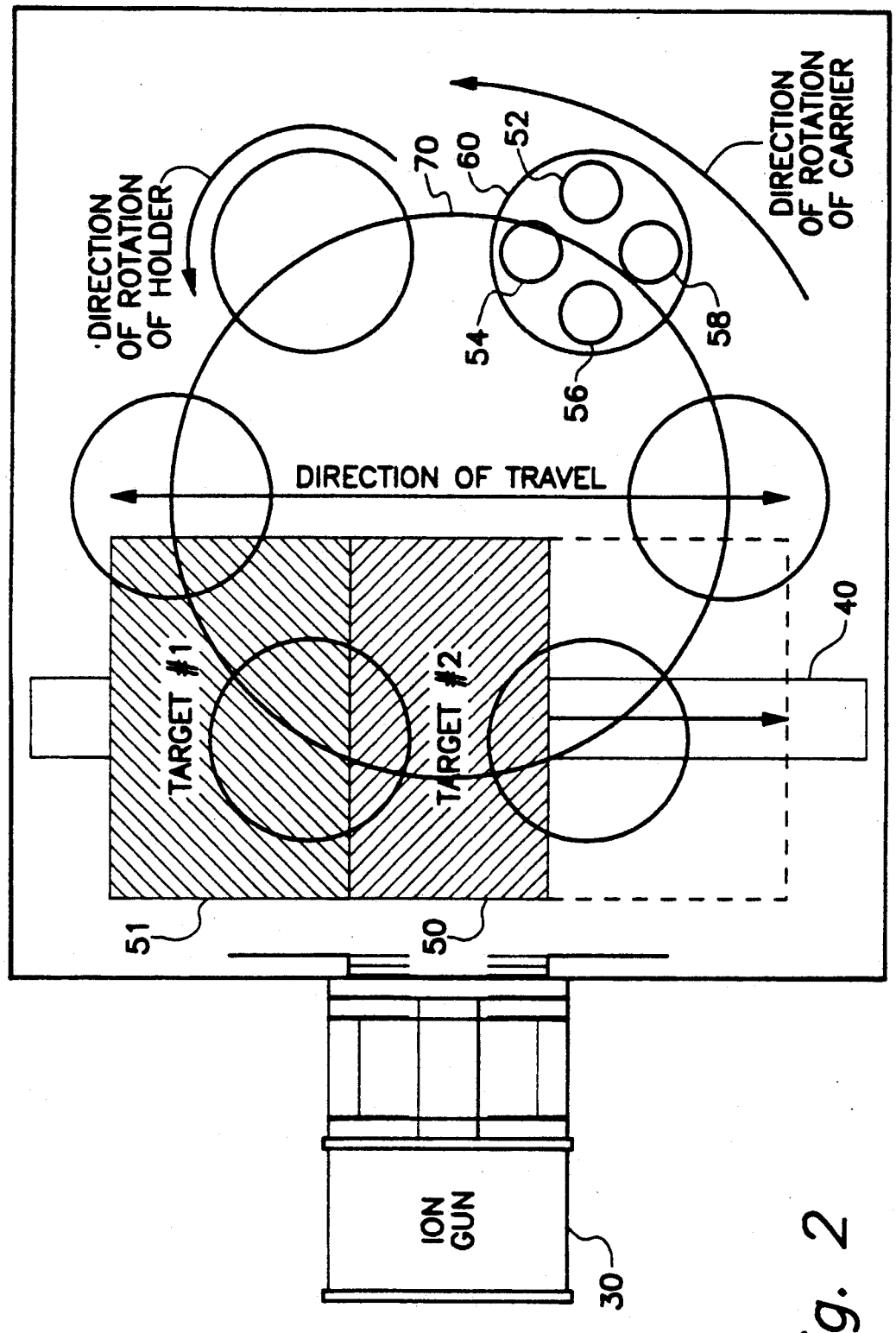
FIG. 2 is a top view of a sputter deposition apparatus as described in the present invention.

Referring now to FIG. 2, it can be seen that the target No. 2 50 can be of one material and another target, target No. 1 51, can be of another material. FIG. 2 also shows how the target holder 40 can translate the targets into and out of the ion beam 42. In this manner, a multitude of different materials can be sputtered deposited on the substrates one layer upon an additional layer without stopping the deposition process. In a preferred embodiment shown in FIG. 2, target material No. 1 51 can be silicon dioxide. In an alternate embodiment, target material No. 1 51 may be silicon dioxide doped with additional materials such as titanium dioxide or zirconium dioxide. Similarly, target No. 2 50, in a preferred embodiment, may be titanium dioxide. In an alternate embodiment, target No. 2 50 may be zirconium dioxide. In a further embodiment, target No. 2 50 may be titanium dioxide doped with between 5% to 20% silicon dioxide. While in a further embodiment, target No. 2 50 may be zirconium dioxide doped with between 5% to 20% silicon dioxide. In this manner, multiple layer optical films may be deposited having alternating layers of silicon dioxide, titanium dioxide, zirconium dioxide or various combinations of silicon dioxide-titanium dioxide mixture or silicon dioxide-zirconium dioxide mixture.

Figure 3:
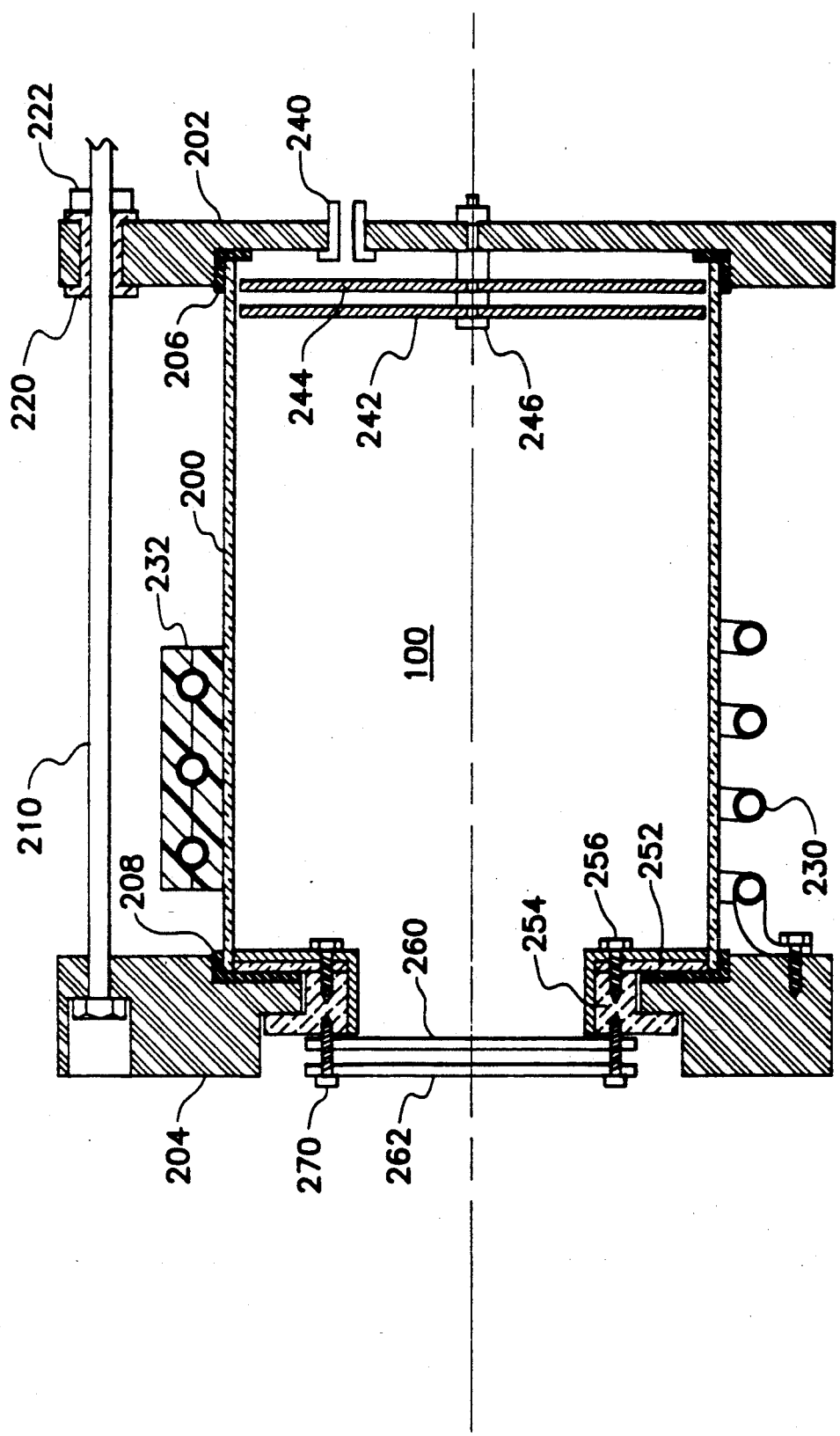
FIG. 3 is a longitudinal cross-section of the ion producing chamber of the ion beam gun of the present invention.

Referring now to FIG. 3, the ion beam gun has a chamber, or vessel, 100 for containing a gas to be ionized. The vessel 100 has side walls 200 which, in the preferred embodiment, is a high temperature cylindrical glass tube. Side wall 200 can, of course, be of any geometric shape such as square, wherein there would be side walls, or other geometric shapes. In an alternate embodiment, the side walls 200 can be made of fused quartz. It has been found, however, that utilizing a high temperature glass for side walls 200 will cut down on the ultraviolet radiation which emanates through the transparent side walls. The only requirement is that the material be high temperature dielectric material so that it does not melt or conduct radio-frequency energy and also be of sufficient integrity that there be minimal sputtering or loss of materials from the inside of the side walls caused by the ionized gas.

The vessel, or chamber, 100 also has a first closed end 202 made of a suitable material such as aluminum and a second end 204 having an aperture therethrough, again made of a suitable material such as aluminum. The aluminum makes an ideal material because it is conductive and it is not affected by the plasma because the plasma is shielded from the aluminum first end 202 and the second end 204 by other components within the vessel 100, as will be explained below.

A seal 206 is provided to mate between the side wall 200 and the first end 202 to form a gas-tight seal. A similar gasket 208 is designed to fit between the side wall 200 and the second end 204, again, to form a gas-tight seal. Suitable through bolts 210 connect the first side wall 202 to the second side wall 204. Because, as will be explained below, the first end 202 and the second end 204 are at different electrical potentials, it is necessary to electrically isolate through bolts 210 from first end 202. A suitable insulator 220 is provided in the first end 202 to prevent the through bolt 210 from being impressed with the electrical signals which will ultimately be placed on the first end 202. A suitable nut 222 completes the assembly to contain the side wall 200 between the first end 202 and the second end 204. A coil 230, in a preferred embodiment constructed of copper tubing, is wound about the outside of the side wall 200, but spaced apart from the side wall 200 by suitable insulators 232. A gas inlet 240 is provided in the first end 202 to allow gas to be injected into the chamber 100.

A first anode plate 242 and a second anode plate 244 are electrically and mechanically connected to a center post 246 which, in turn, is electrically and mechanically connected to the first end 202.

Adjacent to the second end 204 inside the chamber 100 is a resonator 250. Resonator 250 is, in the preferred embodiment, a flat circular titanium plate having an aperture therethrough and outstanding flange about the inside perimeter of the aperture in second end 204. The resonator 250 is electrically insulated and mechanically separated from the second end 204 by a glass insulating plate 252. The resonator 250 is mechanically attached to an insulator 254 by means of titanium screws 256. Within the aperture of the second end 204 is a multi-apertured screen grid 260 and a multi-apertured accelerator grid 262 which are spaced apart and held by insulating spacers 270 which attach to the insulator 254.

Figure 4:
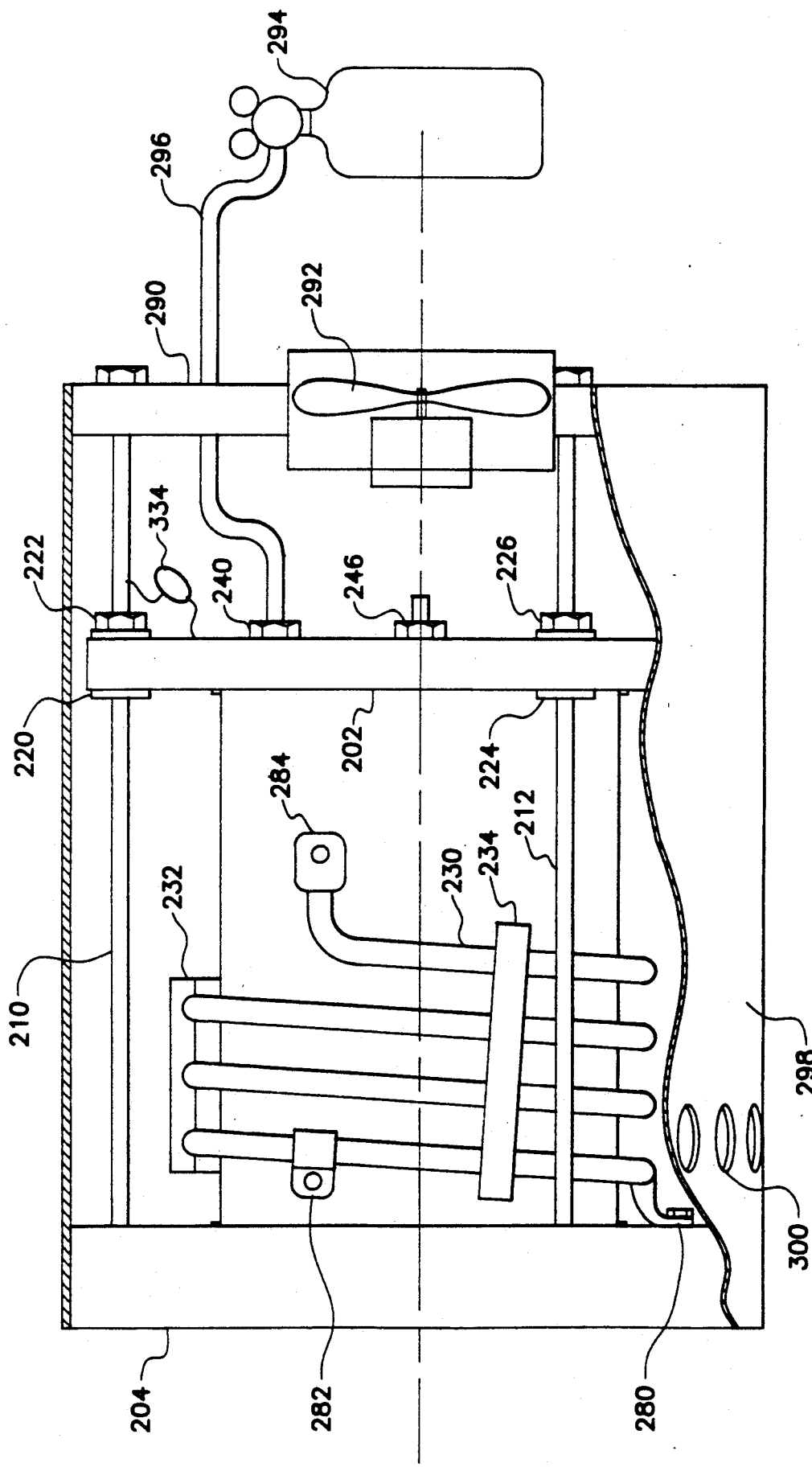
FIG. 4 is a partially cut away longitudinal view of the ion beam gun of the present invention.

Referring now to FIG. 4, an additional through bolt 212, an additional insulating spacer 224 and attachment nut 226 are shown in more detail. Similarly, an additional standoff insulator 234, similar to 232, is shown holding the coil 230.

The coil 230 is a length of conductive material wound into a solenoid of between three and four turns about the outside of side walls 200. The coil 230, in a preferred embodiment, is approximately three and one-half turns about the side walls 200 of ⅜ inch diameter thin wall copper tubing. The coil 230 has a first end 280 which, in the preferred embodiment, is attached to the second end of the chamber 204 and a second end 284 which has an electrical connection which will be explained below. In addition, an intermediate point has an electrical connector 282 attached. The intermediate point is approximately one-third of a turn from the first end 280 of the coil 230.

The complete gun assembly has a fan mounting flange 290 which is spaced apart from the first end 202. The flange has an aperture with a fan 292 located therein. Fan 292 forces cooling air through the ion beam gun between the outside of the side wall 200 and a metal protective shield 298. The air exits from exit holes 300 located about the periphery of the shield 298 in the area of the second end 204.

As can be seen in FIG. 4, a source of gas 38 is transmitted by means of tubing 296 to the gas inlet port 240 to be introduced into the chamber 100.

Figure 5:
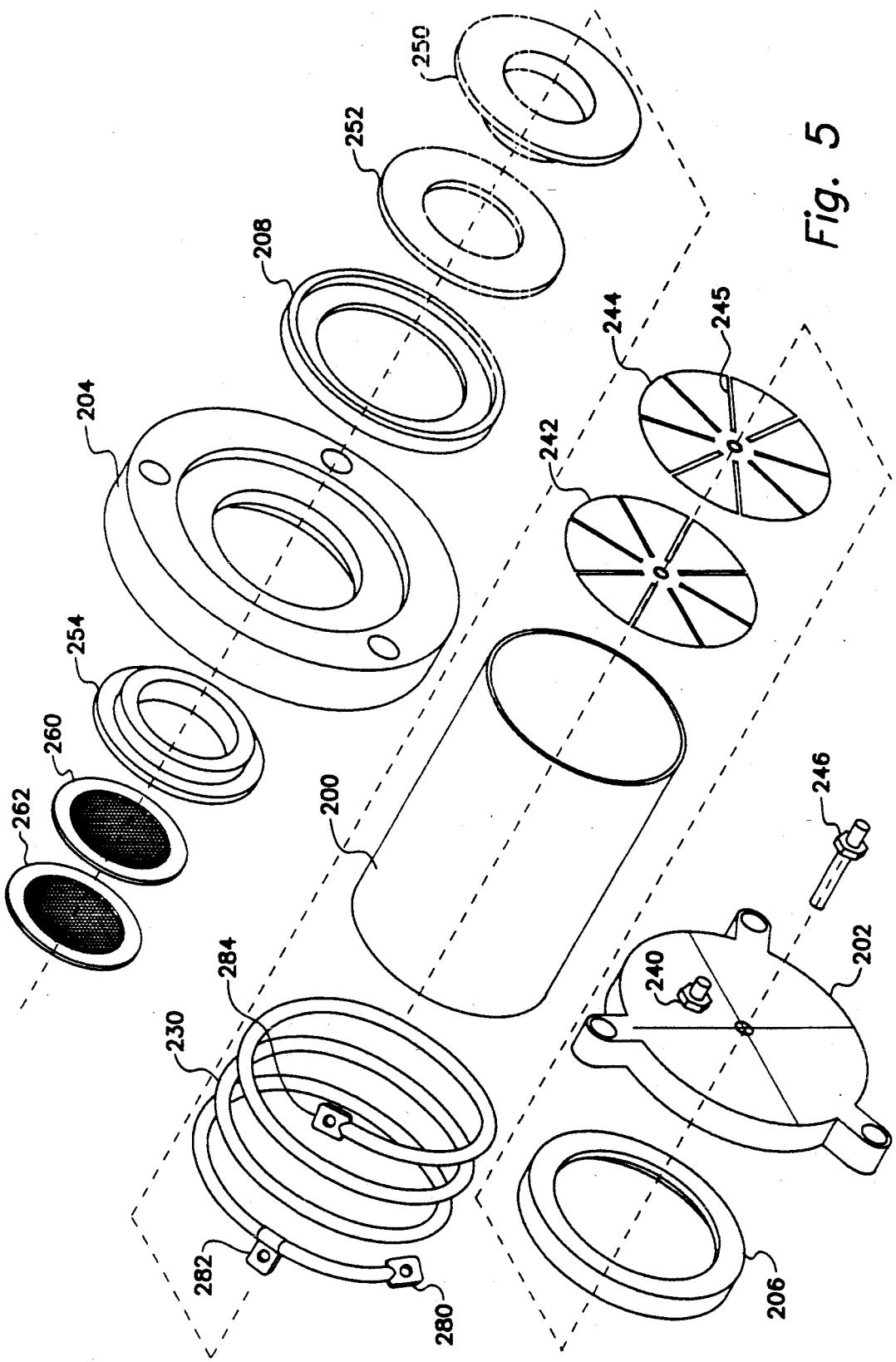
FIG. 5 is a perspective blow-up view of the components of the ion producing chamber of the ion beam gun of the present invention.

Referring now to FIG. 5, a more detailed description of the various components can be seen. In the preferred embodiment, the anode consists of two plates, a first anode plate 242 and a second anode plate 244 spaced apart and mounted on a common central post 246. The post 246 is mechanically and electrically connected to the first end plate 202 of the vessel.

The first anode plate 242 and the second anode plate 244 each have a plurality of slits 245 radiating outwardly from the center post 246 toward the perimeter of each plate. In the preferred embodiment, there are eight slits in both the first anode plate 242 and the second anode plate 244. The second anode plate 244 is rotated, or orientated, on the center post 246 in such a way that the slits 245 in the first anode plate 242 do not overlap the slits 245 in the second anode plate 244. The slits prevent any eddy currents from being induced in either the first anode plate 242 or the second anode plate 244 by the radio-frequency energy impressed on the coil 230. The slits 245 also provide a gas path to uniformly disperse and diffuse the gas within the vessel.

Second anode plate 244 is spaced apart from the side wall 200 of the vessel 100 and from the first end plate 202 so that no plasma will be generated between the second anode plate 244 and the first end plate 202. Similarly, the first anode plate 242 is spaced apart from the side wall 200 and the second anode plate 244 in such a manner as to prevent a plasma from being generated between the first anode plate 242 and the second anode plate 244.

Experimentation has shown that arcing could occur from the plasma to the coil 230 through the insulating side wall 200 if the coil 230 is placed directly on the insulating side wall 200. Another problem with placing the coil 230 directly against the insulating side wall 200 is that material from the inside surface of the side wall 200 could sputter off the inside of the side wall 200, decreasing the side wall 200 strength and contaminating the ion beam with the sputtered material. Placing the coil 230 directly against side walls 200 can also cause hot spots on side walls 200 which can lead to additional problems.

Spacing the coil 230 apart from the side wall 200 to provide an air gap between the coil 230 and the side wall 200 minimizes these problems. The coil 230, in the preferred embodiment, is spaced apart from the side wall 200 by means of a plurality of insulating spacers, such as spacer 232 and spacer 234. This not only prevents arcing, contamination and sputtering of the side wall 200, but also provides an air path between the coil 230 and the side wall 200 to allow cooling air from the fan 292 to further cool the coil 230 and the surface of the side wall 200.

Again, referring to FIG. 5, more specific detail of screen grid 260 and accelerator grid 262 can be seen. The screen grid 260 has a plurality of apertures. These apertures in the screen grid 260 are holes approximately 0.075 inches in diameter and having a density of approximately 100 holes per square inch. The accelerator grid 262, similarly, has a plurality of apertures. The apertures in the accelerator grid 262 are approximately 0.050 inches in diameter and have a density of approximately 100 holes per square inch. Both the screen grid 260 and the accelerator grid 262 are, in the preferred embodiment, constructed out of a graphite material. The apertures in the screen grid 260 and the apertures in the accelerator grid 262 are aligned one to the other.

Figure 6:
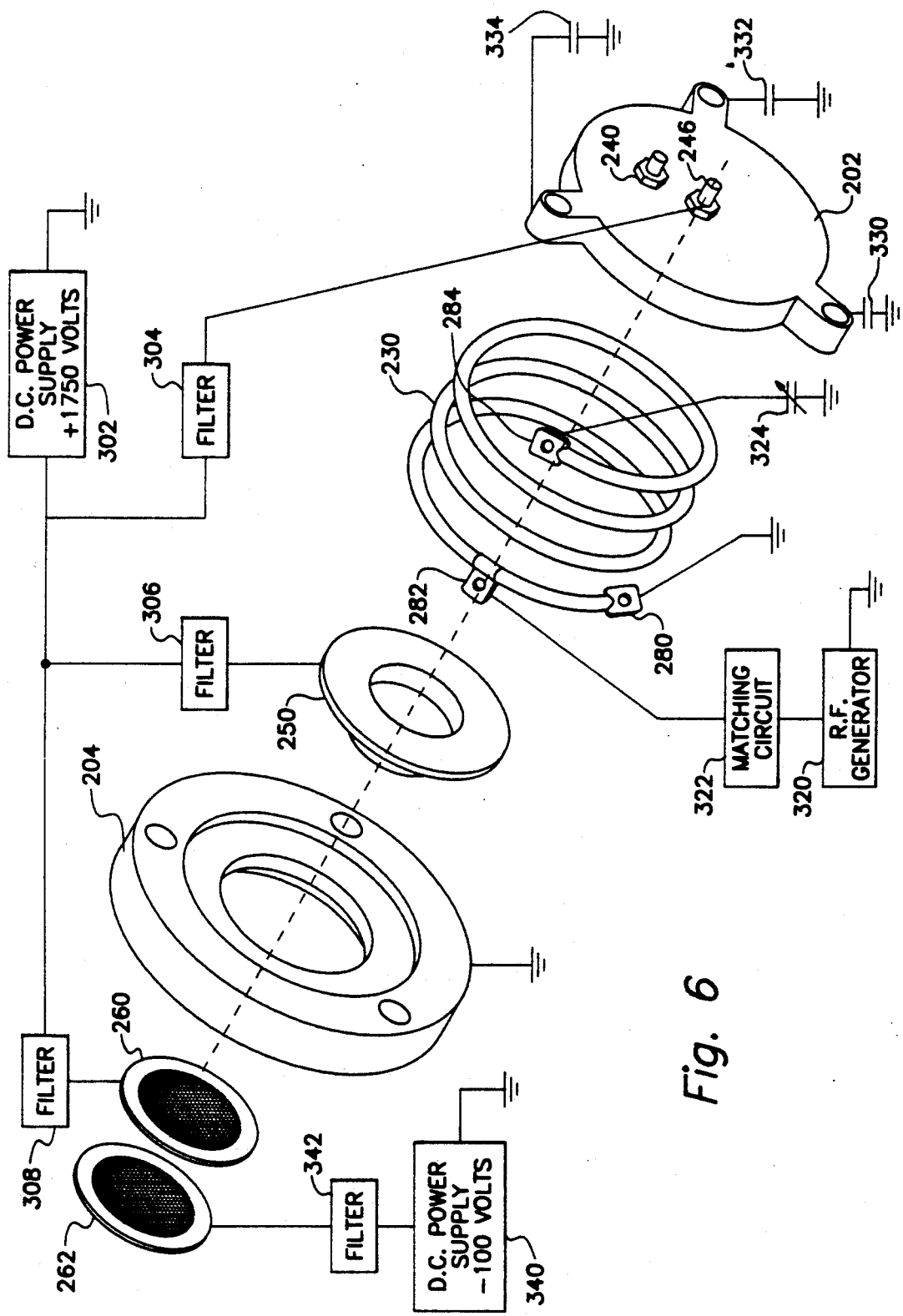
FIG. 6 is an electrical block diagram showing the electrical components and their interconnection to the components of the ion producing chamber of the ion beam gun of the present invention.

Referring now to FIG. 6, the electrical interconnection of the various components to the ion beam gun can be seen in detail. A direct current power supply 302, which is adjustable between approximately 1000 volts and 2000 volts, is provided to supply electrical potential through filter 304 to the first end 202 of the ion beam gun through an electrical connection to the center post 246. Power supply 302 also supplies its voltage through a filter 306 to the resonator 250. Similarly, the same voltage is applied through filter 308 to the screen 260. This positive DC potential, which in the preferred embodiment, has been found to be effective at 1750 volts, is used to partially contain the plasma and prevent the plasma from contacting either the first anode plate 242, the resonator 250 or the screen 260. The power supply 302 is a second power supply.

The first power supply is the radio-frequency generator 320. The radio-frequency generator 320 can supply energy having a frequency which is variable between 6 megahertz to 50 megahertz and power between a few watts to several hundred watts. The radio-frequency generator 320, in the preferred embodiment, outputs a standard industrial frequency of 13.56 megahertz. The radio-frequency energy is sent through a matching circuit 322 and connected to the intermediate point 282 of the coil 230. The first end of the coil 230 is connected to the second end plate 204 which is grounded and, therefore, the first end of the coil 230 is at ground potential. The second end 284 of the coil 230 is connected to a first end of a variable capacitor 324, which is variable between the range of 5 microfarads to 100 microfarads. A second end of variable capacitor 324 is connected to ground.

A plurality of capacitors 330, 332 and 334, typically 0.01 picofarads capacitors, have their first end connected to the first end 202 of the vessel 100. A second end of capacitors 330, 332, and 334 is connected to ground. In the preferred embodiment, as shown in FIG. 4, this connection is made through the through bolts, such as through bolt 210. Capacitors 330, 332 and 334 drain off any induced radio-frequency charge induced in the first end 202 by the radio-frequency energy supplied to coil 230. It should be noted that the RF energy supplied to coil 230 does induce eddy currents in resonator 250. It has been found that the inducing of the eddy currents in resonator 250 increases the beam strength of the output beam of the ion beam gun by approximately 20% when used in conjunction with the capacitors 330, 332 and 334. A third power supply 340 supplies a negative DC potential through filter 342 to the accelerator grid 262. This extracts the ions from inside chamber 100 to be used for the purposes intended.

It has been found that by using an input wattage from the RF generator of approximately 550 watts that an output beam of 1750 volts at 200 milliamperes of current can be achieved.

OPERATION

In operation, sample holders 60 and 62 are removed from vacuum chamber 20 and loaded with a plurality of substrates 52, 54 etc. The substrate holders 60 and 62 are then inserted onto carrier 70 along with a plurality of other holders holding a plurality of substrates.

A plurality of targets 50 and 51 are placed on target holder 40 within the vacuum chamber 20. The vacuum chamber 20 is then closed and sealed and evacuated by vacuum pump 22. The ion beam gun 30 is then supplied with an inert gas 38 and activated, as will be explained below.

A supply of inert gas, such as xenon or argon, is supplied through source 38 into the inside of chamber 100 at a flow of 3.5 standard cubic centimeters per minute. The gas is diffused through slots 245 in second anode plate 244, and slots 245 in the first anode plate 242 and about the perimeter of anode plates 242 and 244 to uniformly disperse within the chamber 100.

The coil 230 is supplied with radio-frequency energy from the first power supply, radio-frequency generator 320 through matching circuit 322. The frequency of the radio-frequency generator is, in the preferred embodiment, 13.56 megahertz with an output power of 550 watts. The matching circuit 322 matches the output impedance of the radio-frequency generator 320 to a transmission line impedance of 50 ohms. The transmission line from the matching circuit 322 is connected to the intermediate point 282 on coil 230 so that the impedance from the intermediate point 282 to ground is near 50 ohms when the plasma is generated and operating.

The first end 202 of vessel 100 and, subsequently, the anode plates 242 and 244 are supplied with 1750 volts DC from the second power supply 302. The second power supply 302 also supplies 1750 volts DC to the resonator 250 and screen grid 260.

The ions thus generated are extracted from the vessel 100 by applying a second direct current voltage, which in the preferred embodiment is a negative 100 volts, from the third power supply 340 onto accelerator grid 342. In the preferred embodiment described above, the output of the ion beam has been determined to be 200 milliamperes at 1750 volts.

Having illustrated and described the principles of the invention in a preferred embodiment, it should be apparent to those skilled in the art that the invention can be modified in arrangement and detail without departing from such principles. I claim all modifications coming within the spirit and scope of the following claims.

I claim:

1. An apparatus of deposit multilayer films comprising:
   a) a vacuum chamber;
   b) a plurality of substrate holders located within said vacuum chamber, each of said plurality of substrate holders holding a plurality of substrates;
   c) a first rotational means for rotating each of said substrate holders;
   d) a carrier within said vacuum chamber for holding all of said substrate holders;
   e) a second rotational means for rotating said carrier;
   f) a translatable target holder mounted within said vacuum chamber at an angle to said carrier;
   g) a first target and a second target positioned adjacent one another on said target holder
   h) an ion beam gun mounted on said vacuum chamber to produce a stream of positively charged ions by radio-frequency excitation, said stream of positively charged ions directed to said target holder at an acute angle;
   i) a pair of shutters mounted in said vacuum chamber in said stream of positively charged ions between said ion beam gun and said target holder to shape said stream of positively charged ions;
   j) a source of inert gas to supply a gas to be ionized to said ion beam gun;
   k) a source of reactive gas to supply reactive gas to said vacuum chamber; and
   l) a neutralizer within said vacuum chamber to neutralize said stream of positively charged ions to prevent a build up of ions within said vacuum chamber.

2. An apparatus to deposit multilayer films as recited in claim 1 wherein said inert gas is argon or xenon.

3. An apparatus to deposit multilayer films as recited in claim 1 wherein said reactive gas is oxygen.

4. An apparatus to deposit multilayer films as recited in claim 1 wherein said translatable target holder can position either said first target or said second target into said stream of positively charged ions.

5. An apparatus to deposit multilayer films as recited in claim 1 wherein said first target is silicon dioxide.

6. An apparatus as recited in claim 1 wherein said second target is titanium dioxide.

7. An apparatus as recited in claim 1 wherein said second target is zirconium dioxide.

8. An apparatus as recited in claim 1 wherein said second target is a combination of titanium dioxide and silicon dioxide.

9. An apparatus for depositing multilayer films as recited in claim 1 wherein said second target is a combination of zirconium dioxide and silicon dioxide.

10. An apparatus for depositing multilayer films as recited in claim 1 wherein said shutters are titanium discs.

11. An apparatus to deposit multilayer films comprising:
    a) a radio-frequency excited ion generating means for supplying a stream of high energy ions to bombard a target to sputter molecules off the target to be deposited on a substrate;

b) a target translation means to position one of several targets, each of a different material, into said stream of high energy ions; and c) a substrate holder means to translate said substrate into and out of a path of said sputtered molecules.

12. An apparatus to deposit multilayer films as recited in claim 11 wherein said radio-frequency excited ion generating means comprises:

a) a vessel having an inside, an outside, side walls, a first end and a second end, for containing a gas to be ionized;

b) a coil spaced apart from the outside of said vessel;

c) a high-frequency generator connected to said coil for introducing radio-frequency energy into said coil to ionize said gas within the inside of said vessel into positively charged ions which form a plasma;

d) a resonator within said vessel adjacent to said second end of said vessel for enhancing said plasma; and e) an extraction means for removing said positively charged ions from said vessel.

13. An apparatus to deposit multilayer films as recited in claim 12 wherein said extraction means includes a multi-apertured grid having a negative direct current voltage applied thereto.

14. An apparatus for depositing multilayer films as recited in claim 12 wherein said resonator is a circular metal plate having an aperture therethrough which is an electrode for receiving radio-frequency from said coil.

15. An apparatus for depositing multilayer films as recited in claim 12 wherein said coil is a solenoid of approximately three and one half turns, said coil having a first end, a second end and an intermediate point, said intermediate point approximately one-third of a turn from said first end and said first end electrically connected to ground potential, said second end connected to a variable capacitor, and said intermediate point connected to said high-frequency generator.

* * * * *